(12) United States Patent
Porter

(10) Patent No.: US 6,992,939 B2
(45) Date of Patent: Jan. 31, 2006

(54) METHOD AND APPARATUS FOR IDENTIFYING SHORT CIRCUITS IN AN INTEGRATED CIRCUIT DEVICE

(75) Inventor: Stephen R. Porter, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 137 days.

(21) Appl. No.: 10/764,675

(22) Filed: Jan. 26, 2004

(65) Prior Publication Data

US 2005/0162915 A1    Jul. 28, 2005

(51) Int. Cl.
  *G11C 7/00*    (2006.01)
(52) U.S. Cl. ............... 365/201; 365/189.07; 365/202; 365/196; 365/205
(58) Field of Classification Search ............... 365/201, 365/202, 196, 205, 189.07
  See application file for complete search history.

(56) References Cited

U.S. PATENT DOCUMENTS

| | | | |
|---|---|---|---|
| 4,692,900 A | * | 9/1987 | Ooami et al. ................. 365/63 |
| 5,274,276 A | | 12/1993 | Casper et al. ................. 326/21 |
| 5,297,087 A | | 3/1994 | Porter ......................... 365/201 |
| 5,304,506 A | | 4/1994 | Porter et al. ................. 438/394 |
| 5,331,594 A | * | 7/1994 | Hotta .......................... 365/201 |
| 5,369,317 A | | 11/1994 | Casper et al. ................. 326/87 |
| 5,440,516 A | * | 8/1995 | Slemmer ...................... 365/201 |
| 5,793,686 A | * | 8/1998 | Furutani et al. ............. 365/201 |
| 5,892,720 A | * | 4/1999 | Stave et al. .................. 365/201 |
| 5,901,078 A | | 5/1999 | Porter et al. ................. 365/149 |
| 5,903,502 A | | 5/1999 | Porter ......................... 365/201 |
| 6,002,623 A | * | 12/1999 | Stave et al. .................. 365/201 |
| 6,114,878 A | | 9/2000 | Loughmiller et al. ........ 326/101 |
| 6,141,272 A | | 10/2000 | Van de Graaff et al. ..... 365/201 |
| 6,219,293 B1 | | 4/2001 | Butler et al. ................. 365/226 |
| 6,249,468 B1 | * | 6/2001 | Kan et al. ..................... 365/201 |
| 6,266,287 B1 | | 7/2001 | Porter ......................... 365/205 |
| 6,269,037 B1 | | 7/2001 | Porter ......................... 365/201 |
| 6,275,409 B1 | | 8/2001 | Porter et al. ................. 365/149 |
| 6,297,998 B1 | | 10/2001 | Van de Graaff et al. ..... 365/201 |

(Continued)

FOREIGN PATENT DOCUMENTS

JP    02001195900 A    *    7/2001

*Primary Examiner*—Viet Q. Nguyen
(74) *Attorney, Agent, or Firm*—Fletcher Yoder

(57) ABSTRACT

The disclosed embodiments relate to a method and apparatus for identifying short circuits in an integrated circuit device. The method may comprise the acts of programming a first memory cell associated with a first digit line to a first data value, programming a second memory cell associated with a second digit line to a second data value, the second data value being complementary with respect to the first data value, firing a first sense amplifier associated with the first digit line, firing a second sense amplifier associated with the second digit line after a time delay with respect to the act of firing the first sense amplifier associated with the first digit line, detecting a measured data value associated with the second digit line, and comparing the measured data value to the second data value to determine whether the first digit line is short circuited to the second digit line. The apparatus may comprise a first sense amplifier that is associated with a first digit line, a second sense amplifier that is associated with a second digit line, and a circuit that delays a firing operation of the second sense amplifier with respect to a firing operation of the first sense amplifier to allow detection of a short circuit between the first digit line and the second digit line.

26 Claims, 4 Drawing Sheets

U.S. PATENT DOCUMENTS

| | | | |
|---|---|---|---|
| 6,351,425 B1 | 2/2002 | Porter | 365/225 |
| 6,355,508 B1 | 3/2002 | Porter et al. | 438/140 |
| 6,365,937 B1 | 4/2002 | Porter et al. | 257/355 |
| 6,385,098 B2 | 5/2002 | Butler et al. | 365/189 |
| 6,396,300 B1 | 5/2002 | Loughmiller et al. | 326/16 |
| 6,438,049 B1 | 8/2002 | Porter | 365/203 |
| 6,445,610 B1 | 9/2002 | Porter et al. | 365/149 |
| 6,496,421 B1 | 12/2002 | Van De Graaf et al. | 365/189 |
| 6,515,923 B1 * | 2/2003 | Cleeves | 365/201 |
| 6,515,925 B2 | 2/2003 | Graham et al. | 365/205 |
| 6,576,960 B2 | 6/2003 | Porter et al. | 257/355 |
| 6,593,218 B2 | 7/2003 | Porter et al. | 438/527 |
| 6,628,144 B2 | 9/2003 | Loughmiller et al. | 326/101 |
| 6,704,238 B2 * | 3/2004 | Izutsu et al. | 365/230.03 |
| 6,781,897 B2 * | 8/2004 | Dvir et al. | 365/201 |

* cited by examiner

METHOD AND APPARATUS FOR IDENTIFYING SHORT CIRCUITS IN AN INTEGRATED CIRCUIT DEVICE

BACKGROUND OF THE INVENTION

1. Field of the Invention

This present invention relates generally to the field of integrated circuit design and, more specifically, to a memory device design that facilitates detection of short circuits between bitlines in a memory device.

2. Description of the Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light, and not as admissions of prior art.

Memory devices, such as static random access memory ("SRAM") and dynamic random access memory ("DRAM"), may include arrays of memory cells that each store a bit or element of data. Each data bit or element may represent a logical low ("0") or a logical high ("1"), which may correspond to a voltage level of a circuit element disposed within the memory cell. As an example, a voltage level close to ground may be representative a logical low or "0" and a voltage level close to a supply voltage for the memory device may be representative of a logical high or "1." The electrical paths that carry the voltage representing a bit or element of data to and from memory cells may be referred to as a data line, a bitline or a digit line. A DRAM device may additionally include wordlines, which enable a plurality of bitlines to be accessed so that data may be written to or read from corresponding memory cells.

Some memory devices have complementary bitlines for each memory cell. The complementary bitlines are designed so that they are always in opposite logic states. In other words, when the data stored in the memory cell corresponds to a logical "0", the data on the complimentary bit line for that cell will be a logical "1" and vice versa. Sense amplifier circuits may be coupled between complimentary bitlines to improve access to data stored in the memory cell. A sense amplifier amplifies a signal corresponding to the difference between two voltage levels. The output of a sense amplifier provides an early indication of whether the logic level of a given memory cell is going to change or remain unchanged.

As integrated circuit feature sizes continue to get smaller, distances between adjacent bitlines continue to decrease as well. Accordingly, there is an increasing possibility that adjacent device features, such as bitlines, may be short circuited to each other. In other words, adjacent bitlines may be unintentionally connected to each other during manufacture. If a short circuit develops between adjacent bitlines, the DRAM device may produce erroneous data when installed in an electronic device such as a computer system or the like. The electronic device in which the defective DRAM is installed may experience performance problems or may not function at all.

BRIEF DESCRIPTION OF THE DRAWINGS

Advantages of the invention may become apparent upon reading the following detailed description and upon reference to the drawings in which.

DETAILED DESCRIPTION OF SPECIFIC EMBODIMENTS

One or more specific embodiments of the present invention will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Figure 1:
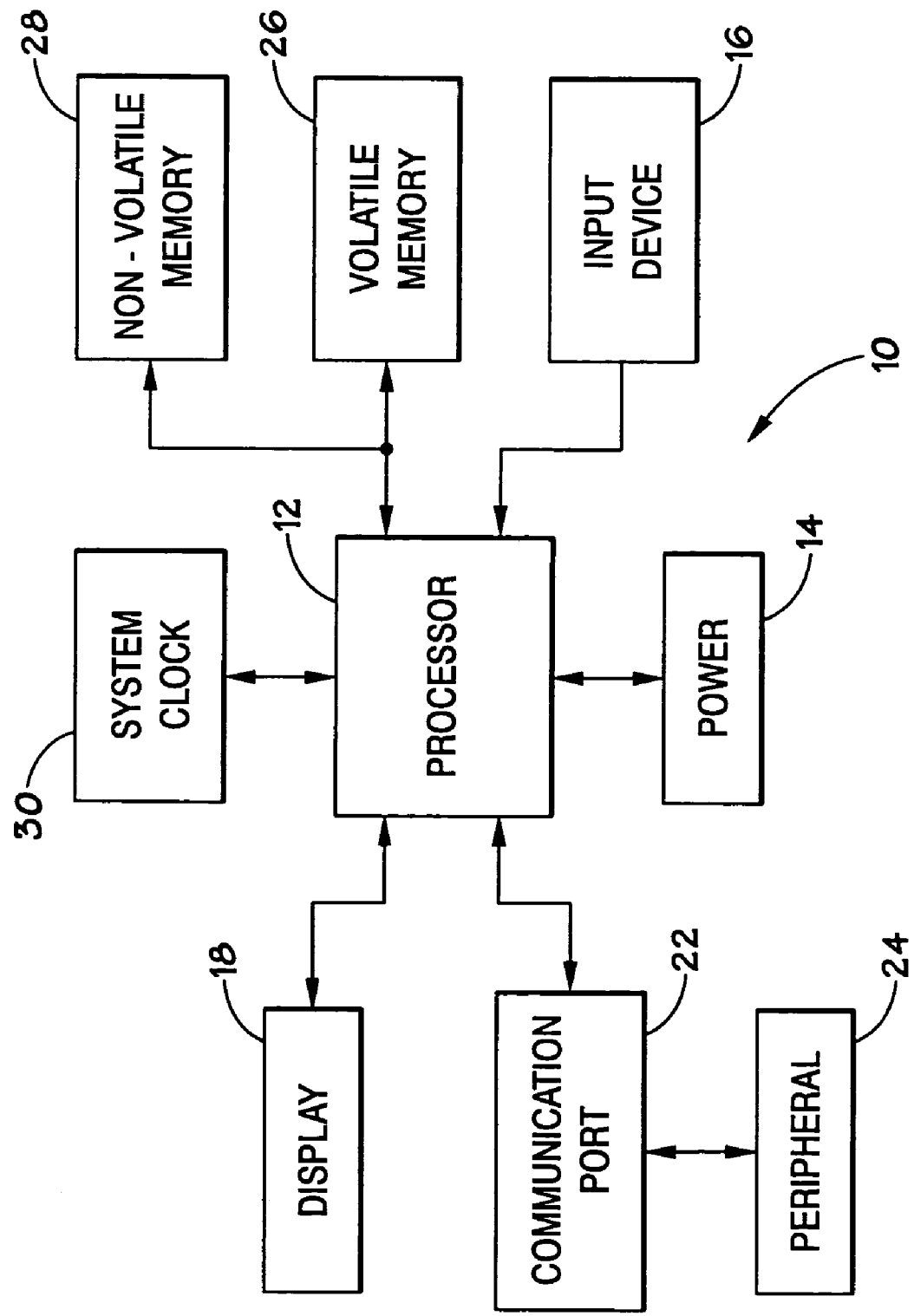
FIG. 1 is a block diagram of an electronic device containing integrated circuit devices that may employ embodiments of the present invention.

FIG. 1 is a block diagram of an electronic device containing integrated circuit devices that may employ embodiments of the present invention. The electronic device or system, which is generally referred to by the reference numeral 10, may be any of a variety of types such as a computer, pager, cellular phone, personal organizer or the like. In a processor-based device, a processor 12, such as a microprocessor, may control the operation of system functions and requests. The processor 12 may be coupled to various types of memory devices to facilitate its operation. For example the processor 12 may be connected to a volatile memory 26 and a non-volatile memory 28. The volatile memory 26 may comprise a variety of memory types, such as static random access memory ("SRAM") or dynamic random access memory ("DRAM") or the like. The non-volatile memory 28 may comprise various types of memory such as electrically programmable read only memory ("EPROM"), and/or flash memory or the like.

The system 10 may include a power supply 14, which may comprise a battery or batteries, an AC power adapter and/or a DC power adapter. Various other devices may be coupled to the processor 12 depending on the functions that the system 10 performs. For example, an input device 16 may be coupled to the processor 12 to receive input from a user. The input device 16 may comprise a user interface and may include buttons, switches, a keyboard, a light pen, a mouse, a digitizer and/or a voice recognition system or the like. An audio or video display 18 may also be coupled to the processor 12 to provide information to the user.

A communications port 22 may be adapted to provide a communication interface between the electronic device 10 and peripheral devices 24. The peripheral 24 may include a docking station, expansion bay or other external component.

Furthermore, an RF sub-system/baseband processor 20 may be coupled to the processor 12 to provide wireless communication capability.

The processor 12, the non-volatile memory 28 and the volatile memory 26 may be implemented as one or more integrated circuit components. Also, the processor 12, the non-volatile memory 28, and the volatile memory 26 are examples of integrated circuit components that may include sense amplifier circuits constructed in accordance with embodiments of the present invention.

Figure 2:
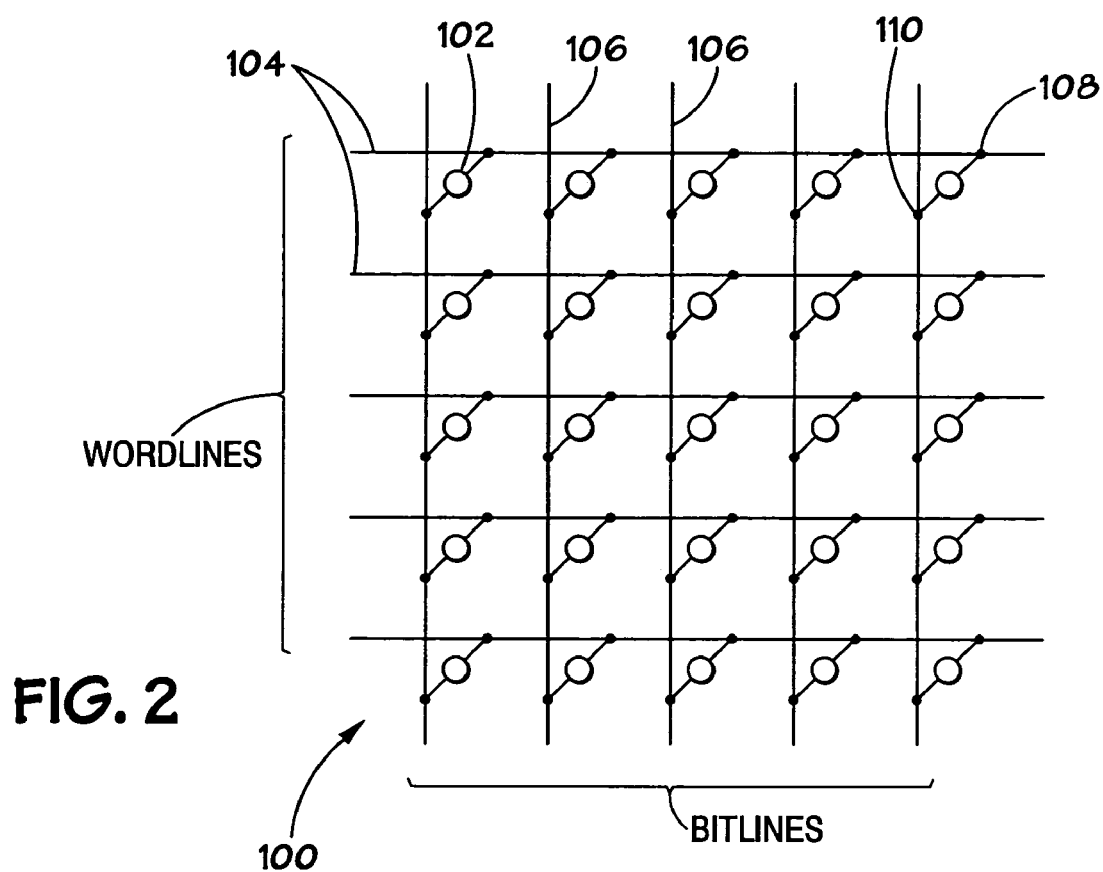
FIG. 2 illustrates a portion of a memory array that may employ embodiments of the present invention.

FIG. 2 illustrates a portion of a memory array, which may be included in one or more of the integrated circuit devices illustrated as part of the electronic device 10 in FIG. 1. The memory array is referred to generally by the reference numeral 100. As can be seen, the memory array 100 includes a plurality of memory cells 102 that are arranged in generally perpendicular rows and columns. The memory cells 102 in each row are coupled together by a respective word line 104, and the memory cells 102 in each column are coupled together by a respective bitline or digit line 106. Specifically, each memory cell 102 includes a word line node 108 that is coupled to a respective word line 104, and each memory cell 102 includes a digit line node 110 that is coupled to a respective bitline 106. Address lines may be electrically coupled to an integrated circuit such as a processor or memory controller so that each of the memory cells 102 can be accessed for storage and retrieval of information.

Figure 3:
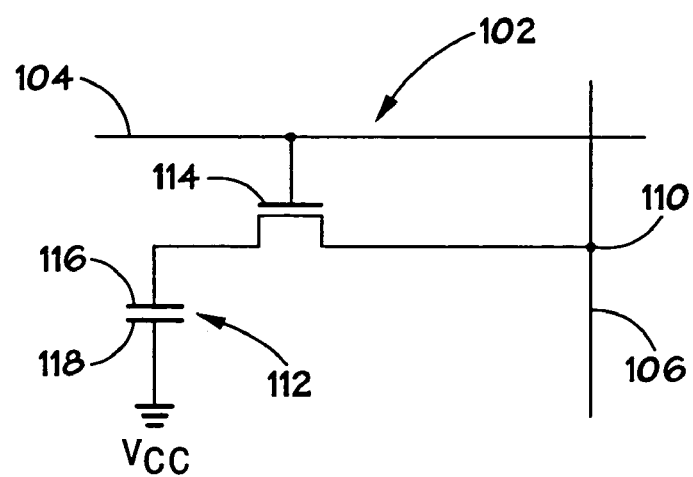
FIG. 3 illustrates an electric schematic diagram of an exemplary memory cell in the array of FIG. 2.

FIG. 3 illustrates an exemplary memory cell 102 that may be used in the memory array 100. The memory cell 102 includes a memory element 112 that may be coupled to an access device 114. The memory element 112 may be a capacitive memory element such as a storage capacitor, and the access device 114 may be a MOSFET transistor. Capacitors may be used as the storage element in DRAM or other memory types. The gate of the transistor 114 may be coupled to the word line 104 to form the word line node 108, and one terminal of the transistor 114 maybe coupled to the bitline 106 to form the bitline node 110. One plate 116 of the memory element 112 may be coupled to the other terminal of the transistor 114, and the other plate 118 of the memory element 112 may be coupled to a voltage level $V_{cc}$, which is typically circuit ground.

Figure 4:
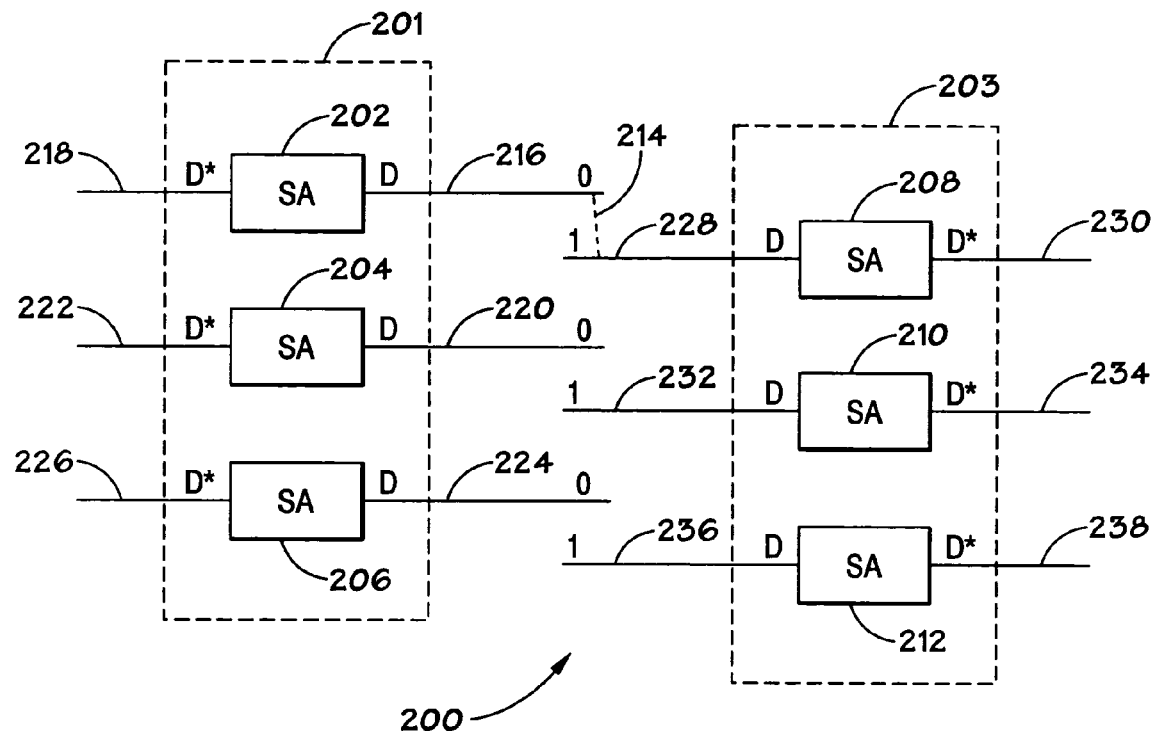
FIG. 4 is a block diagram showing the internal structures of a DRAM device in which embodiments of the present invention may be employed.

FIG. 4 is a block diagram showing the internal structures of a DRAM device in which embodiments of the present invention may be employed. The DRAM device shown in FIG. 4 is generally referred to by the reference numeral 200. The DRAM device 200 includes a first bank 201 (indicated by dashed lines) of sense amplifiers and a second bank 203 (indicated by dashed lines) of sense amplifiers. The first bank 201 includes a sense amplifier 202, a sense amplifier 204, and a sense amplifier 206. The second bank 203 of sense amplifiers includes a sense amplifier 208, a sense amplifier 210, and a sense amplifier 212. Those of ordinary skill in the art will appreciate that each of the banks 201, 203 of sense amplifiers may contain any number of sense amplifiers. Three sense amplifiers are shown in each bank in FIG. 4 for purposes of illustration only. Each of the sense amplifiers 202, 204, 206, 208, 210 and 212 are associated with a memory cell (see FIG. 3) that may be programmed to a logical data value of either "0" or "1".

In the first bank 201 of sense amplifiers, the sense amplifier 202 is connected to a digit line 216 and a complementary digit line 218. The sense amplifier 204 is connected to a digit line 220 and a complementary digit line 222. The sense amplifier 206 is connected to a digit line 224 and a complementary digit line 226. In FIG. 4, the output of the digit lines is identified as D and the output of the complementary digit lines is identified as D*.

In the second bank 203 of sense amplifiers, the sense amplifier 208 is connected to a digit line 228 and a complementary digit line 230. The sense amplifier 210 is connected to a digit line 232 and a complementary digit line 234. The sense amplifier 212 is connected to a digit line 236 and a complementary digit line 238.

Embodiments of the present invention may be employed to determine whether a short exists between adjacent digit lines. A short 214, shown as a dashed line in FIG. 4, connects the digit line 216 to the digit line 228. The digit line 216 and the digit line 228 are adjacent to each other in the DRAM device 200.

In the normal operation of the DRAM device 200, the sense amplifiers in the first bank 201 and the second bank 203 would typically be fired simultaneously. The simultaneous firing of both banks of sense amplifiers results in reduced capacitive coupling between digit lines and helps to increase operational speed of the DRAM device 200. However, the simultaneous firing of all sense amplifiers may mask the presence of short circuits such as the short 214. To assist in identifying the short 214, the memory cells associated with the first bank 201 of sense amplifiers and digit lines may be programmed to contain the same data value. The memory cells associated with the second bank 203 of sense amplifiers and digit lines may be programmed to contain the opposite or complementary data value. For example, FIG. 4 illustrates the state in which the memory cells associated with the digit lines 216, 220, and 224 are programmed to a logical value of "0". The memory cells associated with the digit lines 228, 232, and 236 are programmed to be complementary data value of "1".

Instead of being fired simultaneously, the first bank 201 of sense amplifiers may be fired prior to the second bank 203 of sense amplifiers. The time delay between the firing of the first bank 201 of sense amplifiers and the second bank 203 of sense amplifiers may be in the range of 2 to 15 nanoseconds. This process may be applied to the DRAM device 200 as part of a test mode during their manufacture.

When the first bank 201 of sense amplifiers is fired, a short between adjacent lines (such as the short 214) will cause the digit line associated with the second bank 203 of sense amplifiers to be pulled in the direction of the data value on the digit line associated with the first bank 201 of sense amplifiers. For example, the short 214 will cause the data value on the digit line 228 (a logical "1") to be pulled in the direction of the value of the data on the digit line 216 (a logical "0"). This biasing of the data value on the digit line associated with the second bank 203 of sense amplifiers will cause the expected data value (i.e. the value to which that digit line was initially programmed) to be incorrect. Thus, the short 214 can be identified and possibly corrected during the manufacturing process.

Figure 5:
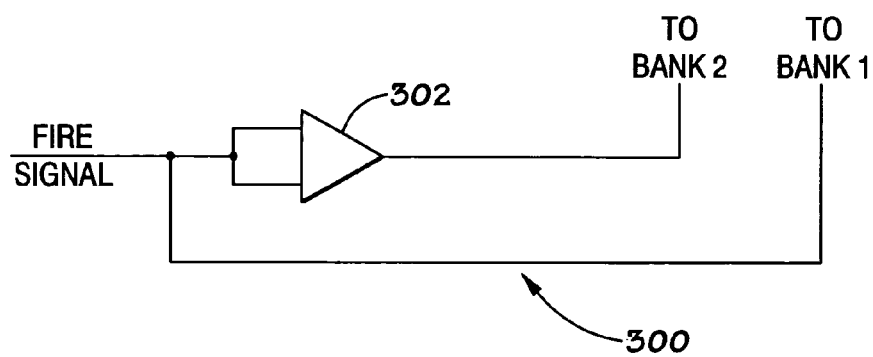
FIG. 5 is a block diagram showing a circuit that may be used to fire banks of sense amplifiers in accordance with an embodiment of the present invention.

FIG. 5 is a block diagram showing a circuit that may be used to fire banks of sense amplifiers in accordance with an embodiment of the present invention. The circuit is generally referred to by the reference numeral 300. A fire signal that is used to activate the sense amplifiers in a DRAM device is delivered to a first bank of sense amplifiers, as shown in FIG. 5. The first bank of sense amplifiers may correspond to the first bank 201 illustrated in FIG. 4. The fire signal is delivered to a delay element 302 prior to being used to fire a second bank of sense amplifiers. The second bank of sense amplifiers may correspond to the second bank 203 illustrated in FIG. 4. The delay provided by the delay element 302 may be fixed or programmable. In addition, the delay element 302 may be implemented so that it is in the path the fire signal takes to reach the second bank of sense amplifiers during a test mode but is switched out of the path when the DRAM device is operating normally.

Figure 6:
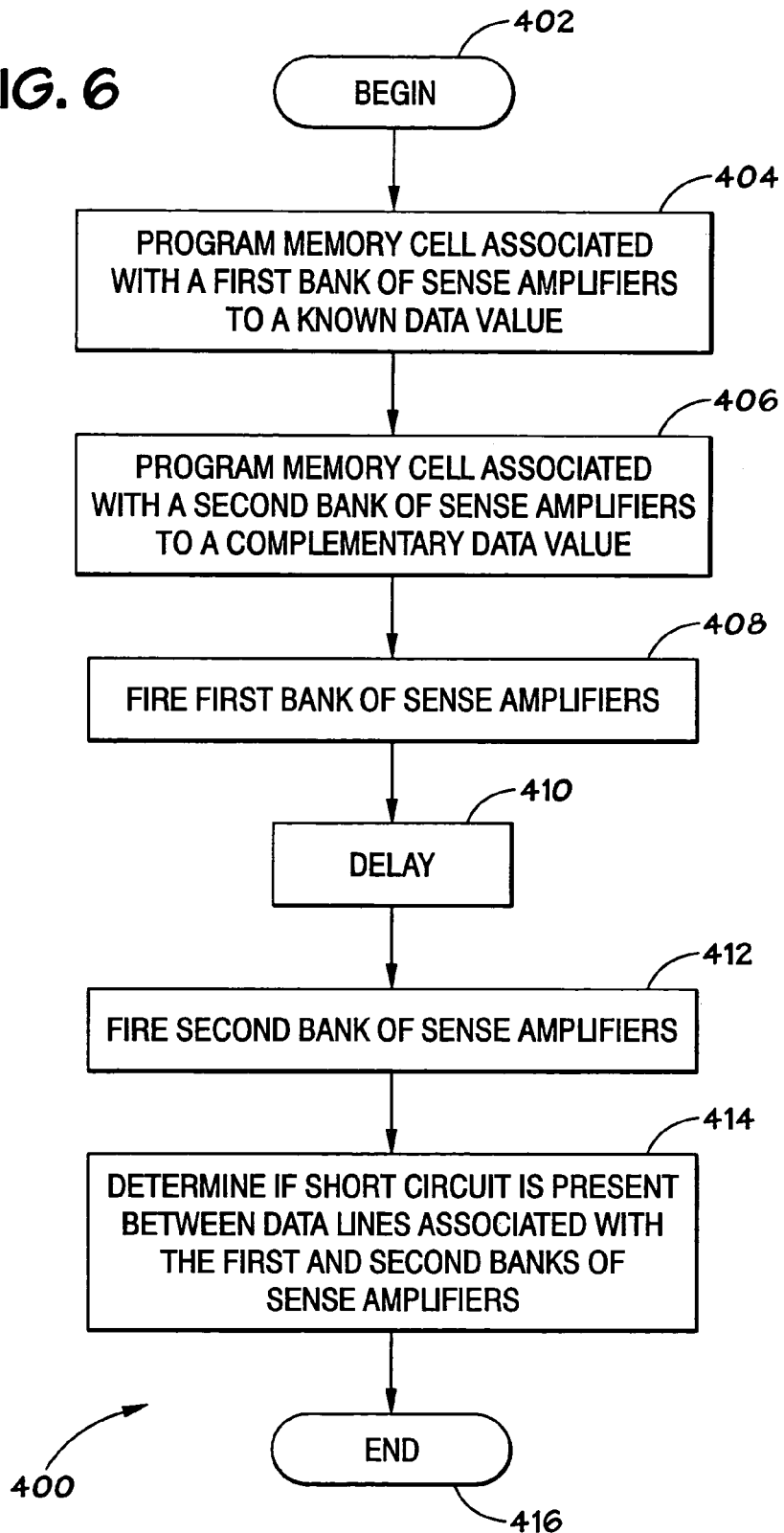
FIG. 6 is a flow diagram illustrating a process in accordance with embodiments of the present invention.

FIG. 6 is a flow diagram illustrating a process in accordance with embodiments of the present invention. The process is generally referred to by the reference numeral 400. At block 402, the process begins.

At block 404, the memory cells associated with the first bank of sense amplifiers and digit lines is programmed to a known data value. The first bank of sense amplifiers may correspond to the first bank 201 of sense amplifiers illustrated in FIG. 4. At block 406, the memory cells associated with a second bank of sense amplifiers and digit lines are programmed to a complementary data value. The second bank of sense amplifiers may correspond to the second bank 203 of sense amplifiers illustrated in FIG. 4. The first bank of sense amplifiers is chosen so that the digit lines associated therewith are adjacent to the digit lines associated with the second bank of sense amplifiers. In this manner, embodiments of the present invention may facilitate the detection of short circuits between adjacent digit lines.

At block 408, the first bank of sense amplifiers is fired or activated. As shown at blocks 410 and 412, a delay is interposed between the firing of the first bank of sense amplifiers and the firing of the second bank of sense amplifiers. This delay allows data on the digit lines associated with the second bank of sense amplifiers to be pulled away from its true value if one of those digit lines is shorted to an adjacent digit line associated with the first bank of sense amplifiers. Thus, the delay will cause the data on the digit line associated with the second bank of sense amplifiers to be misread.

At block 414, the presence of short circuits between digit lines associated with the first and second banks of sense amplifiers is determined. This determination may be made by reading the data from the digit lines associated with the second bank of sense amplifiers and comparing that data to an expected value (i.e. the value to which the digit line was initially programmed). If any of the digit lines associated with the second bank of sense amplifiers does not produce the expected value of data, it is likely that that digit line is shorted to the adjacent digit line associated with the first bank of sense amplifiers. The short circuit may then be corrected. If the defect cannot be corrected, the device in which the short circuit occurred may be scrapped before being incorporated into a product. At block 416, the process ends.

While the invention may be susceptible to various modifications and alternative forms, specific embodiments have been shown by way of example in the drawings and will be described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of operating an integrated circuit device, the method comprising the acts of:
   programming a first memory cell associated with a first digit line to a first data value;
   programming a second memory cell associated with a second digit line to a second data value, the second data value being complementary with respect to the first data value;
   firing a first sense amplifier associated with the first digit line;
   firing a second sense amplifier associated with the second digit line after a time delay with respect to the act of firing the first sense amplifier associated with the first digit line;
   detecting a measured data value associated with the second digit line; and
   comparing the measured data value to the second data value to determine whether the first digit line is short circuited to the second digit line.

2. The method set forth in claim 1, comprising the act of selecting the sense amplifier associated with the first digit line and the sense amplifier associated with the second digit line such that the first digit line and the second digit line are adjacent to each other on the die of an integrated circuit device.

3. The method set forth in claim 1, comprising the act of programming a time value for the time delay.

4. The method set forth in claim 1, wherein the time delay is in the range of 2 to 5 nanoseconds.

5. The method set forth in claim 1, comprising the act of placing the integrated circuit device in a test mode.

6. The method set forth in claim 1, comprising the act of repairing a short circuit between the first digit line and the second digit line.

7. An integrated circuit device, comprising:
   a first sense amplifier that is associated with a first digit line;
   a second sense amplifier that is associated with a second digit line; and
   a circuit that adds a time delay between a firing operation of the second sense amplifier with respect to a firing operation of the first sense amplifier to allow detection of whether a short circuit exists between the first digit line and the second digit line.

8. The integrated circuit device set forth in claim 7, wherein the first digit line and the second digit line are adjacent to each other.

9. The integrated circuit device set forth in claim 7, wherein the time delay is in the range of 2 to 15 nanoseconds.

10. The integrated circuit device set forth in claim 7, wherein the first sense amplifier comprises a portion of a first bank of sense amplifiers and the second sense amplifier comprises a portion of a second bank of sense amplifiers.

11. The integrated circuit device set forth in claim 7, wherein the circuit that adds the time delay operates in a test mode of the integrated circuit device.

12. The integrated circuit device set forth in claim 7, wherein the integrated circuit device comprises a dynamic random access memory ("DRAM") device.

13. The integrated circuit device set forth in claim 7, wherein the integrated circuit device comprises a microprocessor.

14. An integrated circuit device, comprising:
   a first sense amplifier that is associated with a first digit line;
   a second sense amplifier that is associated with a second digit line; and
   means for adding a time delay between a firing operation of the second sense amplifier with respect to a firing operation of the first sense amplifier to allow detection of whether a short circuit exists between the first digit line and the second digit line.

15. The integrated circuit device set forth in claim 14, wherein the first digit line and the second digit line are adjacent to each other.

16. The integrated circuit device set forth in claim 14, wherein the time delay is in the range of 2 to 15 nanoseconds.

17. The integrated circuit device set forth in claim 14, wherein the first sense amplifier comprises a portion of a first bank of sense amplifiers and the second sense amplifier comprises a portion of a second bank of sense amplifiers.

18. The integrated circuit device set forth in claim 14, wherein the means for adding a time delay operates in a test mode of the integrated circuit device.

19. The integrated circuit device set forth in claim 14, wherein the integrated circuit device comprises a dynamic random access memory ("DRAM") device.

20. The integrated circuit device set forth in claim 14, wherein the integrated circuit device comprises a microprocessor.

21. An electronic device, comprising:
   a processor adapted to execute instructions;
   a storage device adapted to store instructions to be executed by the processor; and
   a memory device that receives information stored on the storage device, the memory device comprising:
   a first sense amplifier that is associated with a first digit line;
   a second sense amplifier that is associated with a second digit line; and
   a circuit that adds a time delay between a firing operation of the second sense amplifier with respect to a firing operation of the first sense amplifier to allow detection of whether a short circuit exists between the first digit line and the second digit line.

22. The electronic device set forth in claim 21, wherein the first digit line and the second digit line are adjacent to each other.

23. The electronic device set forth in claim 21, wherein the time delay is in the range of 2 to 15 nanoseconds.

24. The electronic device set forth in claim 21, wherein the first sense amplifier comprises a portion of a first bank of sense amplifiers and the second sense amplifier comprises a portion of a second bank of sense amplifiers.

25. The electronic device set forth in claim 21, wherein the circuit that adds the time delay operates in a test mode of the integrated circuit device.

26. The electronic device set forth in claim 21, wherein the electronic device comprises a computer system.

* * * * *